United States Patent
Morita et al.

(10) Patent No.: US 6,346,505 B1
(45) Date of Patent: Feb. 12, 2002

(54) CLEANING SOLUTION FOR ELECTROMATERIALS AND METHOD FOR USING SAME

(75) Inventors: Hiroshi Morita, Hadano; Tetsuo Mizuniwa, Yokosuka; Junichi Ida, Koga, all of (JP)

(73) Assignee: Kurita Water Industries, Ltd. (JP)

( * ) Notice: Subject to any disclaimer, the term of this patent is extended or adjusted under 35 U.S.C. 154(b) by 0 days.

(21) Appl. No.: 09/229,877

(22) Filed: Jan. 14, 1999

(30) Foreign Application Priority Data

Jan. 16, 1998 (JP) ............................................. 10-006221
Feb. 2, 1998 (JP) ............................................. 10-021201

(51) Int. Cl.$^7$ ............................................. H01L 21/306
(52) U.S. Cl. ........................... 510/175; 510/257; 134/1; 134/1.3; 134/2; 134/3
(58) Field of Search ............................... 134/1, 1.1, 1.2, 134/1.3, 2, 34, 28, 902; 438/903; 510/175, 176, 257

(56) References Cited

U.S. PATENT DOCUMENTS 5,340,437 A   8/1994   Erk et al.
5,676,760 A * 10/1997  Aoki et al. .................. 134/1.3

FOREIGN PATENT DOCUMENTS

| JP | 03228327 | | 10/1991 |
| JP | 06069303 | | 3/1994 |
| JP | 07081902 | | 3/1995 |
| JP | 07312359 | | 11/1995 |
| JP | 08078376 | | 3/1996 |
| JP | 408181094 | * | 7/1996 |
| JP | 09064146 | | 3/1997 |

* cited by examiner

Primary Examiner—Yogendra N. Gupta
Assistant Examiner—Gregory E. Webb
(74) Attorney, Agent, or Firm—Morrison Law Firm

(57) ABSTRACT

A cleaning solution for electromaterials including hydrogen fluoride and either oxygen or hydrogen gas dissolved in water. The cleaning solution may alternatively include hydrogen fluoride, hydrochloric acid or nitric acid, and hydrogen or oxygen gas dissolved in water. Alternatively, the cleaning solution includes hydrogen fluoride, hydrogen peroxide and oxygen gas dissolved in water. The present invention also provides a method for cleaning electromaterials including applying an ultrasonic vibration to cleaning solution applied to electromaterials.

20 Claims, No Drawings

CLEANING SOLUTION FOR ELECTROMATERIALS AND METHOD FOR USING SAME

BACKGROUND OF THE INVENTION

The present invention relates to a cleaning solution for electromaterials. In particular, the present invention relates to wet cleaning of electromaterials using a cleaning solution that can simultaneously remove metal impurities, natural oxidation films, and particle contamination. The present invention is capable of removing both metal contamination and particles adhered to the surface of electromaterials without using surface active agents. The present invention also relates to a method of using the cleaning solution.

In the prior art, cleaning of semiconductor silicon substrates, liquid crystal glass substrates, and photomask quartz substrates is done by cleaning at high temperatures with concentrated chemicals, including hydrogen peroxide, then rinsing with ultrapure water. The hydrogen peroxide based chemical solutions used in the prior art include: a solution of hydrogen peroxide and sulfuric acid; a solution of hydrogen peroxide and hydrochloric acid; a solution of hydrogen peroxide and ammonia; and the like. This method of cleaning is called the RCA cleaning method. The RCA cleaning method is an effective method for removing metals from a semiconductor surface. At the same time, particles adhering to the surface of the semiconductor are also removed. However, the RCA has several problems. Since a large volume of hydrogen peroxide, highly concentrated acids or bases, and the like are used, the cost for chemicals is high. In addition, using the RCA methods results in costs for rinsing with ultrapure water, processing resulting contaminated waste streams, and removing contamination from contaminated air streams. In addition, local exhaust ventilation and replacement of exhausted air with tempered clean air incurs costs. Recently, wet cleaning processes have been reassessed in order to reduce costs, and to reduce the negative environmental impacts including using high volumes of water, generating a high volume of waste chemicals and releasing waste gases.

The prior art includes a five step process as an alternative to the RCA cleaning method. First, organic contamination and metal contamination are removed from the surface of the electromaterial using ultrapure water containing ozone. Second, remaining particle contamination is removed by transmitting ultrasonic waves while applying ultrapure water containing hydrogen fluoride, hydrogen peroxide and surface agents. Third, residual surface active agents are removed by transmitting ultrasonic waves while applying ultrapure water containing ozone. Fourth, the chemical oxidation film generated in step 3 is removed using dilute hydrofluoric acid. Fifth, a final rinse is conducted by transmitting ultrasound waves while rinsing with ultrapure water. This process uses dilute chemical solutions at room temperature. It results in cost savings related to reduced chemical and energy costs. However, since the process requires five steps, it would be advantageous to have a less complex cleaning process.

Also in the prior art, is a process of removing natural oxidation film from a silicon surface, which involves processing with hydrofluoric acid chemicals at room temperature. In particular, a "last hydrofluoric acid" step using a dilute hydrofluoric acid is often used for cleaning silicon wafers. The purpose of hydrofluoric acid cleaning is to remove the natural oxidation film that may be generated on the silicon surface during either an acidic chemical processing step, a rinse processing, or when a film is generated while the wafer is left standing.

Hydrofluoric acid cleaning also removes metal impurities which have been taken up inside the natural oxidation film. However, with hydrofluoric acid cleaning, particles adhering to the electromaterial surface cannot be removed. As a result, this step must always be combined with another cleaning process. For example, APM cleaning using a solution containing ammonia and hydrogen peroxide is often used in combination with the hydrofluoric acid cleaning process. Furthermore, a cleaning solution containing hydrofluoric acid has a limited oxidation strength. In this case, complete removal of metal impurities with a high oxidation-reduction potential, such as copper, can be difficult.

A cleaning process has been proposed to improve upon the RCA and other methods of the prior art, which uses a mixture of hydrofluoric acid and hydrochloric acid in water. A cleaning solution having the following ratio is used: hydrofluoric acid (50 weight %), hydrochloric acid (35 weight %), and ultrapure water at a weight ratio of 0.2:1:100. When this solution is used, metals including but not limited to iron, chromium, nickel, copper, and aluminum, can be efficiently removed, even at room temperature. Furthermore, if ultrapure water with low dissolved oxygen gas concentration is used, or if the amount of hydrofluoric acid is increased, the natural oxidation film can be removed, in addition to metal.

Another proposed cleaning solution consists of a mixture of hydrofluoric acid and nitric acid in solution. Although this cleaning solution is highly effective in removing metal, it performs poorly in removing particles. As a result, this cleaning solution must be used in combination with an APM cleaning solution in order to remove particles. Consequently, a cleaning solution for electromaterials is sought that can remove metal impurities, the natural oxidation film from the electromaterial surface, as well as particles adhering to the surface.

OBJECTS AND SUMMARY OF THE INVENTION

In light of the above, it is an object of the present invention to provide a cleaning solution for electromaterials that overcomes the limitations of the prior art.

An object of the present invention is to provide a cleaning solution for electromaterials which can, during wet cleaning, remove not only metal impurities and natural oxidation film, but also particle contamination as well.

It is a further object of the present invention to provide a simpler cleaning solution for electromaterials that can remove metal and particle contamination from the surface of electromaterials while avoiding the use of active surface agents.

The present inventors have conducted intensive research in order to solve the aforementioned problems. It was discovered that a cleaning solution of hydrogen fluoride, or a solution of hydrogen fluoride and either hydrogen chloride or nitric acid, combined with either dissolved hydrogen gas or dissolved oxygen gas, is effective in removing particles adhering to the surface of electromaterials. At the same time, the cleaning solution has various cleaning capabilities including metal contamination removal, natural oxidation film removal, and complete hydrogen termination of the electromaterial surface.

In addition, the present inventors have realized that if the surface active agents used in the five step process of the prior art can be eliminated, then steps 3 and 4 become unnecessary. After intensive research, it was discovered that particle and metal contamination on the surface of electromaterials can both be removed by using a solution of hydrogen fluoride, hydrogen peroxide and dissolved oxygen gas. The present invention is a result of these discoveries.

Briefly stated, the present invention is a cleaning solution for electromaterials, including an aqueous solution containing hydrogen fluoride and dissolved hydrogen gas.

An embodiment of the present invention is a cleaning solution for electromaterials, including an aqueous solution containing hydrogen fluoride and dissolved oxygen gas.

Another embodiment of the present invention is a cleaning solution for electromaterials, including an aqueous solution containing hydrogen fluoride, hydrogen peroxide and dissolved oxygen gas.

Another embodiment of the present invention is a cleaning solution for electromaterials, containing a solution of hydrogen fluoride, either hydrogen chloride or nitric acid, and dissolved oxygen gas.

Another embodiment of the present invention is a cleaning solution for electromaterials, containing a solution of hydrogen fluoride, either hydrogen chloride or nitric acid, and dissolved hydrogen gas.

Another embodiment of the present invention is a method for cleaning electromaterials including: forming a cleaning solution by admixture of water, hydrogen fluoride, and either hydrogen gas or oxygen gas, applying cleaning solution to the electromaterials, and applying ultrasonic vibrations to the cleaning solution during the cleaning step.

Another embodiment of the present invention is a method for cleaning electromaterials including: forming a cleaning solution by admixture of water, hydrogen fluoride, hydrochloric acid or nitric acid, and either hydrogen gas or oxygen gas, applying cleaning solution to the electromaterials, and applying ultrasonic vibrations to the cleaning solution during the cleaning step.

Another embodiment of the present invention is a method for cleaning electromaterials including: forming a cleaning solution by admixture of water, hydrogen fluoride, hydrogen peroxide and oxygen gas, applying cleaning solution to the electromaterials, and applying ultrasonic vibrations to the cleaning solution during the cleaning step.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

By using the cleaning solution of the present invention, particles adhering to the surface of electromaterials can be effectively removed. Depending on the particular objective, one may choose from among the various embodiments of the cleaning solution of the present invention, to achieve removal of metal contaminants adhering to the surface, removal of natural oxidation film and complete hydrogen termination, at the same time as particle removal. As a result, by using the cleaning solution of the present invention, the wet cleaning process of electromaterials can be simplified.

A first embodiment of the present invention includes an aqueous solution of hydrogen fluoride and dissolved hydrogen gas. This embodiment provides effective removal of particles adhering to the surface of electromaterials, as well as removal of natural oxidation film. Furthermore, complete hydrogen termination of the outer surface of the silicon is achieved.

There are no particular limitations on the concentration of hydrogen fluoride in this first embodiment. A hydrogen fluoride concentration of between 0.05 to 5 weight % is preferred, and between 0.1 weight % to 1 weight % is more preferable. When the concentration of hydrogen fluoride is less than 0.05 weight %, the effectiveness in removing the natural oxide film could be inadequate. Normally, an adequate cleaning effect is shown with a hydrogen fluoride concentration of 5 weight % or less. If the concentration of hydrogen fluoride exceeds 5 weight %, an excessive amount of rinse water may become necessary.

The cleaning solution of this first embodiment may be a buffered hydrofluoric acid, where ammonium fluoride is dissolved, in addition to hydrogen fluoride. The rate and uniformity of etching of the natural oxidation film on the silicon surface can be improved by using a buffered hydrofluoric acid.

The hydrogen gas concentration is preferably 0.4 mg/liter or greater, more preferably 0.7 mg/liter or greater, and even more preferably 1.0 mg/liter. If the hydrogen gas concentration is less than 0.4 mg/liter, the effectiveness in removing particles may be inadequate.

A second embodiment of the present invention comprises an aqueous solution of hydrogen fluoride and dissolved oxygen gas. Using the cleaning solution of this embodiment results in removal of particles adhering to the surface of the electromaterial, removal of the natural oxidation film on the silicon surface, and removal of metal contamination, such as copper, adhering to the surface. It is believed that the oxygen gas increases the oxidation reduction potential of the cleaning solution, making it possible to remove metal contamination, such as copper. In contrast to the cleaning solution of the previous embodiment, the cleaning solution of this second embodiment can not conduct complete hydrogen termination of the outer surface of the silicon.

There are no particular limitations on the concentration of hydrogen fluoride in this second embodiment. A hydrogen fluoride concentration of between 0.05 to 5 weight % is preferred with between 0.1 weight % to 1 weight % being more preferable. When the concentration of hydrogen fluoride is less than 0.05 weight %, the effectiveness of the cleaning solution in removing the natural oxide film and metals may be inadequate. Normally, an adequate cleaning effect is shown with a hydrogen fluoride concentration of 5 weight % or less. If the concentration of hydrogen fluoride exceeds 5 weight %, an excessive amount of rinse water may become necessary.

In the cleaning solution of this second embodiment, oxygen gas concentration is preferably 12 mg/liter or greater, preferably 20 mg/liter or greater, and even more preferably 30 mg/liter or greater. If the oxygen gas concentration is less than 12 mg/liter, effectiveness of the cleaning solution in removin particles and metal may be inadequate.

A third embodiment of the present invention comprises an aqueous solution of hydrogen fluoride, hydrogen chloride or nitric acid, and dissolved hydrogen gas. By using the cleaning solution of this third embodiment, removal of particles adhering to the surface of the electromaterial, removal of metal contamination, such as copper, adhering to the surface, removal of the natural oxidation film on the silicon surface, and completion of hydrogen termination of the outer surface of the silicon is achieved. The simultaneous removal of particle and metal contamination and natural oxidation film is possible with the cleaning solution of this third embodiment, because the mixture of hydrofluoric acid and hydrogen chloride or nitric acid in solution, is effective in removing metal contamination and natural oxidation film. The hydrogen gas is effective in particle removal and aids in the removal of the natural oxidation film. It is thought that the cleaning solution of this third embodiment is effective due to the combined effects of these compounds.

There are no particular limitations on the concentration of hydrogen fluoride in this third embodiment. A hydrogen fluoride concentration of between 0.05 to 5 weight % is preferable, and between 0.1 weight % is more preferable. When the concentration of hydrogen fluoride is less than 0.05 weight %, the effectiveness in removing the natural oxide film and metals may be inadequate. Normally, an adequate cleaning effect is shown with a hydrogen fluoride concentration of 5 weight % or less. If the concentration of hydrogen fluoride exceeds 5 weight %, an excessive amount of rinse water may become necessary.

There are no particular limitations on the concentration of hydrogen chloride or nitric acid, but a hydrogen chloride or nitric acid concentration of between 0.01 to 5 weight % is preferred, and between 0.1 weight % is more preferable. When the concentration of hydrogen chloride or nitric acid is less than 0.01 weight %, the effectiveness of the cleaning solution in removing metals may be inadequate. Normally, an adequate cleaning effect is achieved with a hydrogen chloride or nitric acid concentration of 5 weight % or less. If the concentration of hydrogen chloride or nitric acid exceeds 5 weight %, an excessive amount of rinse water may become necessary.

Hydrogen gas concentration in this third embodiment is preferably 0.4 mg/liter or greater, and more preferably 0.7 mg/liter or greater, and even more preferably 1.0 mg/liter or greater. If the hydrogen gas concentration is less than 0.4 mg/liter, the effectiveness of the cleaning solution in removing particles may be inadequate.

A fourth embodiment of the present invention comprises a solution of hydrogen fluoride, hydrogen chloride or nitric acid, and dissolved oxygen gas. By using the cleaning solution of this embodiment, removal of particles adhering to the surface, removal of metal contamination, such as copper, adhering to the surface, and removal of the natural oxidation film on the surface are achieved. This fourth embodiment provides greater effectiveness in removing metals compared to the cleaning solution of the third embodiment. However, complete hydrogen termination of the outer surface of the electromaterial is not achieved.

In this fourth embodiment, there are no particular limitations on the concentration of hydrogen fluoride, but a hydrogen fluoride concentration between 0.05 to 5 weight % is preferred, and between 0.1 and 1 weight % is more preferable. When the concentration of hydrogen fluoride is less than 0.05 weight %, the effectiveness of the cleaning solution in removing the natural oxide film and metals may be inadequate. Normally, an adequate cleaning effect is shown with a hydrogen fluoride concentration of 5 weight % or less. If the concentration of hydrogen fluoride exceeds 5 weight %, an excessive amount of rinse water may become necessary.

There are no particular limitations on the concentration of hydrogen chloride or nitric acid in this fourth embodiment. A hydrogen chloride or nitric acid concentration between 0.01 to 5 weight % is preferred with between 0.1 to 1 weight % being preferable. When the concentration of hydrogen chloride or nitric acid is less than 0.01 weight %, the effectiveness in removing metals may be inadequate. Normally, an adequate cleaning effect results from a hydrogen chloride or nitric acid concentration of 5 weight % or less. If the concentration of hydrogen fluoride exceeds 5 weight %, an excessive amount of rinse water may become necessary.

The dissolved oxygen gas concentration of this fourth embodiment is preferably 12 mg/liter or greater, and more preferably 20 mg/liter or greater, and even more preferably 30 mg/liter or greater. If the oxygen gas concentration is less than 12 mg/liter, the cleaning solution's effectiveness in removal of particles and metal may be inadequate.

A fifth embodiment of the present invention comprises a solution of hydrogen fluoride, hydrogen peroxide and dissolved oxygen gas. By using the cleaning solution of this embodiment, effective removal of metal contamination, organic contamination, and particle contamination is achieved at room temperature. There is no need for surface active agents or complex multistep processing. In particular, compared to the five step process of the prior art, the present invention, as exemplified in this fifth embodiment, obviates the need for the steps of using active surface agents, using ozone, and using hydrofluoric acid.

The cleaning solution of this fifth embodiment comprises an aqueous solution of dissolved hydrogen fluoride, hydrogen peroxide and oxygen gas. There are no particular limitations on the concentration of hydrogen fluoride, but a hydrogen fluoride concentration between 0.1 and 1 weight % is preferred. When the concentration of hydrogen fluoride is less than 0.1 weight %, the effectiveness of the cleaning solution in removing the metal and organic contaminants adhering to the electromaterial surface may be inadequate. When the concentration of hydrogen fluoride exceeds 1 weight %, there is no improved in the cleaning effect, however an excessive amount of rinse water may become necessary.

There are no particular limitations on the concentrations of hydrogen peroxide. A hydrogen peroxide concentration of from 0.1 to 10 weight % is preferred. When the concentration of hydrogen peroxide is less than 0.1 weight %, the effectiveness of the cleaning solution in removing the metal and organic contaminants adhering to the electromaterial surface may be inadequate. When the concentration of hydrogen peroxide exceeds 10 weight %, there is no improvement in cleaning effect associated with the increased concentration, however an excessive amount of rinse water may become necessary.

In the cleaning solution of this fifth embodiment, an oxidation film forms on the surface of the electromaterial by oxidative breakdown, in addition to the removal of metal and organic contaminants adhering to the surface of electromaterials. This film can take up a portion of the contaminants. Hydrogen fluoride is thought to remove this film by etching the oxidation film which has taken in metal and organic contaminants. As a result, it is preferred that the concentrations of hydrogen fluoride and hydrogen peroxide balance each other out. Depending on the concentration of hydrogen peroxide, the concentration of hydrogen fluoride can be increased or decreased appropriately.

The concentration of oxygen gas in this fifth embodiment is preferably 20 mg/liter or greater, and more preferably 30 mg/liter or greater. If the oxygen gas concentration is less than 20 mg/liter, the removal of particles adhering to the surface of electromaterials may be inadequate.

There are no particular limitations on the concentration of hydrogen flouride in this fifth embodiment, however between 0.1 to 1 weight percent is preferred. When the concentration of hydrogen fluoride is less than 0.1 weight %, the effectiveness of the cleaning solution in removing metal and organic contaminants adhering to the electromaterial surface may be inadequate. When the concentration of hydrogen fluoride exceeds 1 weight %, there is no improvement in the cleaning effect of the solution. However, an excessive amount of rinse water may become necessary.

There are no particular limitations on the purity of the water used for making the cleaning solution of the present invention. The purity can be selected according to the required surface purity of the object to be washed. In other words, water with purity which is not contaminated relative to the required surface purity of the object can be used. The cleaning solution is prepared by dissolving hydrogen fluoride, or hydrogen fluoride and hydrogen chloride or nitric acid and hydrogen gas or oxygen gas into the water. This cleaning solution is brought into contact with the object to be washed, and contaminants on the surface of the object are removed. Therefore, for simple parts which do not require extreme purity, a cleaning solution can be prepared by dissolving industrial hydrogen fluoride, hydrochloric acid, hydrogen gas, oxygen gas in tap water. However, when cleaning the surface of electromaterials such as semiconductor silicon substrates, liquid crystal glass substrates, photomask quartz substrates, and other precision electronic parts, it is preferred that high purity hydrofluoric acid, hydrochloric acid, hydrogen gas and oxygen gas be dissolved in ultrapure water with an adequate purity. Ultrapure water has, at 25° C., an electrical resistivity of 18 M Ohm or greater, a total organic carbon of 10 micrograms/liter or less, and fewer than 10,000 particles/liter. Furthermore, very small foreign objects in the cleaning solution can be removed by filtering as required.

There are no particular limitations on the method of making the electromaterial cleaning solution of the present invention. For example, it can be made by bubbling hydrogen gas or oxygen gas into water in which the specified concentrations of hydrogen fluoride, or hydrogen fluoride and hydrogen chloride or nitric acid, or hydrogen fluoride and hydrogen peroxide have been dissolved. However, in order to prevent volatilization of hydrogen fluoride or the acid component, it is preferable to add hydrogen fluoride, or hydrogen fluoride and hydrochloric acid or nitric acid, or hydrogen fluoride and hydrogen peroxide to water in which hydrogen gas or oxygen gas has already been dissolved to the specified concentration.

Compared with the amount of water in which hydrogen gas or oxygen gas has been dissolved, the amount of hydrogen fluoride, or hydrogen fluoride and hydrochloric acid or nitric acid, or hydrogen fluoride and hydrogen peroxide, is exceedingly small. As a result, the concentration of hydrogen gas or oxygen gas before adding the hydrogen fluoride, or hydrogen fluoride and hydrochloric acid or nitric acid, or hydrogen fluoride and hydrogen peroxide, is approximately the same as the concentration of the dissolved gas of the resulting cleaning solution.

The preferred method for dissolving hydrogen or oxygen gas into water is by supplying hydrogen gas or oxygen gas to water which has been deaerated and which has a reduced degree of saturation of dissolved gases. The degree of saturation of gas is the amount of gas dissolved in water divided by the amount of gas dissolved at a pressure of $10^5$ Pa, temperature of 20° C. For example, when water is in contact with nitrogen gas at a pressure of $10^5$ Pa and at a temperature of 20° C., the amount of nitrogen gas dissolved in water at equilibrium is 19.2 mg/liter. If the gas dissolved in water is nitrogen gas only, and if the amount dissolved is 19.2 mg/liter, the degree of saturation is 1.0 times. If nitrogen is the only gas dissolved in water, and if the amount of dissolved gas is 9.6 mg/liter, the degree of saturation is 0.5 times.

Water in contact with air at equilibrium, at a pressure of $10^5$ Pa and a temperature of 20° C., has a degree of saturation of 1.0 when 15.4 mg/liter of nitrogen and 8.8 mg/liter of oxygen gas are dissolved in the water. When the water is deaerated, the amount of dissolved nitrogen gas is 1.5 mg/liter, the amount of dissolved oxygen gas is 0.9 mg/liter and the degree of saturation is 0.1 times. When water is in contact with hydrogen gas at equilibrium, at a pressure of $10^5$ Pa and a temperature of 20° C., the amount of dissolved hydrogen gas is 1.6 mg/liter. When only hydrogen gas is dissolved in water, and when the amount of dissolved gas is 0.8 mg/liter, the degree of saturation is 0.5 times. Furthermore, when water is in contact with oxygen gas at equilibrium, at a pressure of $10^5$ Pa and a temperature of 20° C., the amount of dissolved oxygen gas is 44.0 mg/liter. When only oxygen gas is dissolved in water and when the amount of dissolved gas is 22.0 mg/liter, the degree of saturation is 0.5 times.

In the present invention, hydrogen gas or oxygen gas is preferably dissolved after dearating the water and lowering the degree of saturation to create a greater capacity to dissolve gas in the water. In the present invention, gas permeable membrane modules can be used in multiple stages to remove dissolved gas and to dissolve hydrogen or oxygen gas. For example, a gas permeable membrane module can be set up in 2 stages. The first stage gas permeable membrane module is used to perform vacuum membrane deaeration of the total dissolved gases. The later stage gas permeable membrane module is used to dissolve hydrogen gas or oxygen gas. Using this method, it is possible to dissolve oxygen and hydrogen at an approximately fixed amount without releasing excessive amounts of gas.

There are no particular limitations for the method of contact between the cleaning solution of the present invention and the electromaterial contaminated by particles, organic matter, metals, and the like. An appropriate method can be selected according to the type of particle, particle size, and amount of deposition. For example, an electromaterial contaminated with particles can be submerged in cleaning solution and batch cleaned. Alternatively, a sheet cleaning method may be used where one sheet is processed at a time. An example of a sheet cleaning method includes a spin cleaning method where cleaning solution is poured while the contaminated electromaterial is rotated.

When using the cleaning solution to clean electromaterial contaminated with particles, ultrasonic vibrations are preferably transmitted to the cleaning solution. This aids in effective removal of particles and the like. There are no particular limitations to the method of transmitting ultrasonic vibrations to the cleaning solution. For example, in batch cleaning, ultrasonic vibrations can be transmitted to the vat of cleaning solution into which the electromaterials are submerged. In spin cleaning, ultrasonic vibrations can be transmitted by the nozzle piece from which cleaning solution is to be poured. The frequency of the ultrasonic vibration to be transmitted for the present invention is preferably 400 kHz or greater, and more preferably 1 MHz or greater. When vibrations are at several tens of kHz, as in the prior art, removal of especially fine particles from electromaterials may be inadequate. Furthermore, there may be damage to the object to be cleaned due to the cavitation effect of ultrasonic vibrations.

The cleaning solution of the present invention shows an excellent particle removal effect at room temperature. The surface of electromaterials is cleaned with a high particle removal rate. By selecting the embodiment of the cleaning solution to match a particular objective, removal of metal contaminants adhering to the surface, removal of natural oxidation film, or achievement of complete hydrogen termination, can be conducted at the same time as particle removal. As a result, by using the cleaning solution of the present invention, wet cleaning processing of electromaterials, including but not limited to semiconductor silicon substrates, liquid crystal glass substrates, and photomask quartz substrates, can be simplified.

The present invention is described in further detail below by citing specific embodiments. The present invention is not limited to these embodiments.

In the embodiments and comparative examples, the cleaning effect was evaluated by the methods listed below.

(1a) Object to be cleaned A (Used in Embodiments 1–2 and Comparative Example 1)

A 6 inch diameter silicon substrate was submerged for 3 minutes in a copper chloride aqueous solution in which alumina particles of 1 micrometer in diameter or less were dispersed. Afterwards, this was rinsed in ultrapure water, and a contaminated silicon substrate was prepared. This contaminated silicon substrate had a natural oxidation film, and was contaminated with 22,000 particles/substrate and $1.5 \times 10^{10}$ atoms/cm$^2$ of copper.

(1b) Object to be cleaned B (Used in Embodiments 3–4 and Comparative Example 2)

A 6 inch diameter silicon substrate was submerged for 3 minutes in a solution containing copper chloride and iron (I) chloride into which alumina particles of 1 micrometer in diameter or less were dispersed. Then, the substrate was rinsed with ultrapure water. Each substrate thus prepared, had a natural oxidation film, and was contaminated with 22,000 particles/substrate, $1.5 \times 10^{13}$ atoms/cm$^2$ of copper, and $1.5 \times 10^{13}$ atoms/cm$^2$ of iron.

(1c) Object to be cleaned C (Used in Embodiment 5 and Comparative Example 3)

A 6 inch diameter silicon substrate was submerged for 3 minutes in a copper chloride solution into which alumina particles of 1 micrometer in diameter or less were dispersed. Then, the substrate was rinsed in ultrapure water. Each substrate thus prepared contained 22,000 particles/substrate and $1.0 \times 10^{14}$ atoms/cm$^2$ of copper.

(2) Cleaning process

Using a sheet spin cleaning device, cleaning solution which received ultrasonic vibrations was sprayed onto a contaminated silicon substrate from an ultrasonic shooting nozzle [Fin Jet T005J from Pre-Tech Co., Ltd., Fuchu, Tokyo, Japan] which had an internal ultrasonic vibration generator of 1.6 MHz. The flow rate of the cleaning solution was 800 ml/min, and the rotation speed of the substrate was 500 rpm. Cleaning time was for 1 minute. After cleaning, the substrate was rinsed for 30 seconds with ultrapure water. The rotation speed was raised to 1,500 rpm and maintained for 20 seconds. The substrate was then dried.

(3) Evaluation (3–1) Particles

The particles on top of the substrate were measured using a device for detecting foreign objects on substrates [WH-3 from Topcon Corporation, Tokyo, Japan], based on a laser scatter principle.

(3–2) Copper concentration

The copper concentration on the surface of the substrate was measured by a total reflection x-ray fluorescence apparatus [TREX 610T from Technos Co., Ltd., Osaka, Japan]. The lower unit of detection for this method is $2.0 \times 10^9$ atoms/cm$^2$.

(3–3) Iron concentration

The iron concentration on the surface was measured using a total reflection X-ray fluorescence apparatus [TREX 610T from Technos Co., Ltd. Osaka, Japan].

(3–4) Natural oxidation film

The natural oxidation film on the surface was measured by a XPS (X-ray photoelectron spectroscopy) apparatus [AXIS-HS Advanced XPS Imaging Spectrometer from Shimadzu Corp., Kyoto, Japan].

(3–5) Hydrogen termination

The hydrogen termination on the surface of the electromaterial was measured using a FT-IR (Fourier transformation infrared spectroscopy) apparatus [JIR-100 from JEOL Ltd., Tokyo, Japan].

(3–6) Carbon concentration

The carbon concentration on the surface was measured by a total reflection X-ray fluorescence spectroscopy apparatus [TREX 610T from Technos Co., Ltd., Osaka, Japan]. The lower limit of detection of this method is $1.0 \times 10^{12}$ atoms/cm$^2$.

EMBODIMENT 1

Cleaning solution was prepared by mixing 100 weight parts of ultrapure water containing 1.2 mg/liter of dissolved hydrogen gas and 1 weight part of 50 weight % hydrofluoric acid. The contaminated silicon substrate was then cleaned.

After cleaning, the number of particles was 100 particles/substrate or fewer. The copper concentration was $9 \times 10^{11}$ atoms/cm$^2$, there was no natural oxidation film, and hydrogen termination was complete.

EMBODIMENT 2

Cleaning solution was prepared by mixing 100 weight parts of ultrapure water having 30 mg/liter of dissolved oxygen gas and 1 weight part of 50 weight % hydrofluoric acid. The contaminated silicon substrate was then cleaned.

After cleaning, the number of particles was 100 particles/substrate or fewer. The copper concentration was $1 \times 10^{10}$ atoms/cm$^2$. There was no natural oxidation film. Hydrogen termination was incomplete.

COMPARATIVE EXAMPLE 1

Cleaning solution was prepared by mixing 100 weight parts of ultrapure water which was in equilibrium with the atmosphere with 1 weight part of 50 weight % hydrofluoric acid. The contaminated silicon substrate was then cleaned.

After cleaning, the number of particles was 11,000 particles/substrate or less. Copper concentration was $7 \times 10^{11}$ atoms/cm$^2$. There was no natural oxidation film. Hydrogen termination was incomplete.

Referring to Table 1, results of Embodiments 1–2 and Comparative Example 1 are shown.

TABLE 1

| | Dissolved Components | Particles (particles per substrate) | Copper (atoms/cm$^2$) | Natural Oxidation Film | Hydrogen Termination |
|---|---|---|---|---|---|
| Embodiment 1 | H$_2$, HF | <100 | $9 \times 10^{11}$ | None | Complete |
| Embodiment 2 | O$_2$, HF | <100 | $<1 \times 10^{10}$ | None | Incomplete |
| Comparative Example 1 | HF | 11,000 | $7 \times 10^{11}$ | None | Incomplete |

Referring to the results of Table 1, when cleaning solution comprising a solution of hydrofluoric acid and dissolved hydrogen gas or oxygen gas was used, the particles adhering to the surface of the contaminated silicon substrate were removed together with the natural oxide film. Furthermore, in Embodiment 1 in which hydrogen gas was dissolved, complete hydrogen termination was achieved. In Embodiment 2, in which oxygen gas was dissolved, the copper contamination adhering to the surface was removed to a sufficiently low level. In contrast, the cleaning solution of Comparative Example 1, which was a solution of hydrofluoric acid without dissolved hydrogen gas or oxygen gas, removed the natural oxidation film. However, the particle removal rate was only around 50%.

EMBODIMENT 3

Cleaning solution was prepared by mixing 100 weight parts of ultrapure water with 1.0 mg/liter of dissolved hydrogen gas, 0.2 weight parts of 50 weight % hydrofluoric acid, and 1 weight part of 35 weight % of hydrochloric acid. The contaminated silicon substrate was then cleaned.

After cleaning, the number of particles was 100 particles/substrate or less. The copper concentration was $2 \times 10^{10}$ atoms/cm$^2$. The iron concentration was $1 \times 10^{10}$ or less. The natural oxidation film had been removed.

EMBODIMENT 4

Cleaning solution was prepared by mixing 100 weight parts of ultrapure water with 30 mg/liter of dissolved oxygen gas, 0.5 weight parts of 50 weight % hydrofluoric acid, and 1 weight part of 35 weight % of hydrochloric acid. The contaminated silicon substrate was then cleaned.

After cleaning, the number of particles was 100 particles/substrate or fewer. The copper concentration was $1 \times 10^{10}$ atoms/cm$^2$ or less. The iron concentration was $1 \times 10^{10}$ or less. The natural oxidation film had been removed.

COMPARATIVE EXAMPLE 2

Cleaning solution was prepared by mixing 100 weight parts of ultrapure water which was at equilibrium with the atmosphere, 0.2 weight parts of 50 weight % hydrofluoric acid, and 1 weight part of 35 weight % of hydrochloric acid. The contaminated silicon substrate was then cleaned.

After cleaning, the number of particles was 13,000 particles/substrate, copper concentration was $1 \times 10^{10}$ atoms/cm$^2$. The iron concentration was $1 \times 10^{10}$ or less. The natural oxidation film had been removed.

Referring to Table 2, the results of Embodiments 3–4 and Comparative Example 2 are shown.

TABLE 2

| | Dissolved Components | Particles (particles per substrate) | Copper (atoms/cm$^2$) | Iron (atoms/cm$^2$) | Natural Oxidation Film |
|---|---|---|---|---|---|
| Embodiment 3 | H$_2$, HF, HCl | <100 | $2 \times 10^{11}$ | $<1 \times 10^{10}$ | None |
| Embodiment 4 | O$_2$, HF, HCl | <100 | $<1 \times 10^{10}$ | $<1 \times 10^{10}$ | None |
| Comparative Example 2 | HF, HCl | 13,000 | $1 \times 10^{11}$ | $<1 \times 10^{10}$ | None |

Referring to the results in Table 2, when a cleaning solution comprising an aqueous solution of dissolved hydrogen gas or oxygen gas and hydrogen fluoride and hydrogen chloride was used, particles were removed along with copper and iron adhering to the contaminated silicon substrate. With the cleaning solution in Embodiments 3–4, the natural oxidation film was also removed. In contrast to these, with the cleaning solution of Comparative Example 2, comprising an aqueous solution with dissolved hydrogen fluoride and hydrogen chloride and without any dissolved hydrogen gas or oxygen gas, the particle removal rate was only around 40% although the copper and iron adhering to the surface and the natural oxidation film were removed.

EMBODIMENT 5

Cleaning solution was prepared by adding hydrofluoric acid and hydrogen peroxide water to ultrapure water with dissolved oxygen. The concentrations of both the hydrogen fluoride and hydrogen peroxide was 0.5 weight %. The dissolved oxygen gas concentration was 30 mg/liter.

After cleaning the contaminated silicon substrate, the number of adhered particles was 100 particles/substrate or fewer, both the copper and carbon were below the lower detection limit.

COMPARATIVE EXAMPLE 3

Cleaning solution was prepared by adding hydrofluoric acid and hydrogen peroxide water to ultrapure water which was in equilibrium with the atmosphere. The concentrations of both the hydrogen fluoride and hydrogen peroxide was 0.5 weight %. The dissolved oxygen gas concentration was approximately 8 mg/liter.

After cleaning the contaminated silicon substrate, the number of adhered particles was 7,000 particles/substrate or fewer, both the copper and carbon were below the lower detection limit.

COMPARATIVE EXAMPLE 4

Cleaning solution was prepared by adding hydrofluoric acid and hydrogen peroxide water and surface active agent [NCW-601A from Wako Pure Chemicals Industries, Ltd., Osaka, Japan] to ultrapure water which is in equilibrium with the atmosphere. The concentrations of both the hydrogen fluoride and hydrogen peroxide was 0.5 weight %. The concentration of the surface active agent was 50 mg/liter. The dissolved oxygen gas concentration was approximately 8 mg/liter.

After cleaning the contaminated silicon substrate, the number of adhered particles was 100 particles/substrate or fewer, the copper was below the lower detection limit, and carbon was $5.0 \times 10^{12}$ atoms/cm$^2$.

Referring to Table 3, the results of Embodiment 5 and Comparative Examples 3–4 are shown.

TABLE 3

| | Particles (particles per substrate) | Copper (atoms/cm$^2$) | Carbon (atoms/cm$^2$) |
|---|---|---|---|
| Embodiment 5 | <100 | Below detection limit | Below detection limit |
| Comparative Example 3 | 7,000 | Below detection limit | Below detection limit |
| Comparative Example 4 | <100 | Below detection limit | $5.0 \times 10^{12}$ |

Referring to Table 3, for Embodiment 5, comprising a solution of ultrapure water with hydrogen fluoride, hydrogen peroxide and dissolved oxygen gas, particles and copper are removed from the contaminated silicon substrate. There was no adhering of organic matter generated on the silicon substrate. In contrast to this, with the Comparative Example 3, which was a cleaning solution with only dissolved hydrogen fluoride and hydrogen peroxide, the copper on the contaminated silicon substrate was removed, and no adhering organic matter was generated, but approximately ⅓ of the particle contamination was not removed. As a result, a separate step for removing particles is necessary. In Comparative Example 4, which was a cleaning solution with dissolved hydrogen fluoride, hydrogen peroxide and surface active agent, the particles and copper on the contaminated silicon substrate were both removed. However, a cleaning using ozone containing water for the removal of organic material becomes necessary because there was generation of adhering organic material on the silicon substrate. Next, a cleaning for the removal of chemical oxidation film generated by the ozone containing water also becomes necessary.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A cleaning solution for electromaterials, consisting of:
   a source water;
   hydrogen fluoride dissolved in said source water; and
   a dissolved gas in said source water;
   said dissolved gas being selected from the group consisting of hydrogen gas and oxygen gas.

2. A cleaning solution according to claim 1, wherein said hydrogen fluoride is from about 0.005 weight percent to about 5 weight percent of said cleaning solution.

3. A cleaning solution according to claim 1, wherein:
   said dissolved gas is oxygen gas; and
   said oxygen gas concentration is at least about 12 mg/liter of said cleaning solution.

4. A cleaning solution according to claim 1, wherein:
   said dissolved gas is hydrogen gas; and
   said hydrogen gas concentration is at least about 0.4 mg/liter of said cleaning solution.

5. A cleaning solution according to claim 2, wherein:
   said dissolved gas is oxygen gas; and
   said oxygen gas concentration is at least about 12 mg/liter of said cleaning solution.

6. A cleaning solution according to claim 2, wherein:
   said dissolved gas is hydrogen gas; and
   said hydrogen gas concentration is at least about 0.4 mg/liter of said cleaning solution.

7. A cleaning solution for electromaterials, consisting of:
   a source water;
   hydrogen fluoride dissolved in said source water;
   at least one acid dissolved in said source water;
   said at least one acid being selected from the group consisting of hydrochloric acid and nitric acid; and
   a dissolved gas in said source water;
   said dissolved gas being selected from the group consisting of hydrogen gas and oxygen gas.

8. A cleaning solution according to claim 7, wherein:
   said hydrogen fluoride is from about 0.005 weight percent to about 5 weight percent of said cleaning solution; and
   said at least one acid is from about 0.01 weight percent to about 5 weight percent of said cleaning solution.

9. A cleaning solution according to claim 8, wherein:
   said dissolved gas is oxygen gas; and
   said oxygen gas concentration is at least about 12 mg/liter of said cleaning solution.

10. A cleaning solution according to claim 8, wherein:
    said dissolved gas is hydrogen gas; and
    said hydrogen gas concentration is at least about 0.4 mg/liter of said cleaning solution.

11. A cleaning solution for electromaterials, comprising:
    a source water;
    hydrogen fluoride dissolved in said source water;
    hydrogen peroxide dissolved in said source water; and
    oxygen gas dissolved in said source water.

12. A cleaning solution according to claim 11, wherein, said hydrogen fluoride is between about 0.1 weight percent to about 1 weight percent of said cleaning solution.

13. A cleaning solution according to claim 11, wherein said hydrogen peroxide is between about 0.1 weight percent and about 10 weight percent of said cleaning solution.

14. A cleaning solution according to claim 11, wherein said oxygen gas concentration is at least about 20 mg/liter of said cleaning solution.

15. A cleaning solution according to claim 11, wherein said hydrogen fluoride and said hydrogen peroxide are present in said cleaning solution at approximately equivalent concentrations.

16. A method for cleaning electromaterials, comprising:
    forming a cleaning solution by admixture consisting of water, hydrogen fluoride, and a gas selected from the group consisting of dissolved hydrogen gas and dissolved oxygen gas;
    cleaning electromaterials by applying said cleaning solution to said electromaterials; and
    applying ultrasonic vibrations to said cleaning solution during said cleaning step.

17. A method according to claim 16, wherein said ultrasonic vibrations are applied at a frequency of at least 400 kHz.

18. A method according to claim 16, wherein said electromaterials are at least one of a silicone substrate, a glass substrate and a quartz substrate.

19. A method for cleaning electromaterials, comprising:
    forming a cleaning solution by admixture consisting of water, hydrogen fluoride, at least one acid selected from the group consisting of hydrochloric acid and nitric acid, and a dissolved gas selected from the group consisting of hydrogen gas and oxygen gas;
    cleaning electromaterials by applying said cleaning solution to said electromaterials; and
    applying ultrasonic vibrations to said cleaning solution during said cleaning step.

20. A method for cleaning electromaterials, comprising:
    forming a cleaning solution by admixture consisting of water, hydrogen fluoride, hydrogen peroxide, and dissolved oxygen gas;
    cleaning electromaterials by applying said cleaning solution to said electromaterials; and
    applying ultrasonic vibrations to said cleaning solution during said cleaning step.

* * * * *